United States Patent
Lee

(10) Patent No.: US 6,450,683 B1
(45) Date of Patent: Sep. 17, 2002

(54) OPTICAL TEMPERATURE MEASUREMENT AS AN IN SITU MONITOR OF ETCH RATE

(75) Inventor: Szetsen Steven Lee, Taipei (TW)

(73) Assignee: Winbond Electronics Corp., Hsinchu (TW)

(*) Notice: Subject to any disclaimer, the term of this patent is extended or adjusted under 35 U.S.C. 154(b) by 0 days.

(21) Appl. No.: 09/557,125

(22) Filed: Apr. 25, 2000

(30) Foreign Application Priority Data

Feb. 1, 2000 (TW) .................................... 89101699 A

(51) Int. Cl.$^7$ .............................. G01N 1/00; C23F 1/00; G01J 1/00
(52) U.S. Cl. ................................ 374/45; 438/9; 216/60; 156/345; 374/121
(58) Field of Search .................... 374/142, 45, 120, 374/161, 121; 438/9, 16, 723, 714; 216/60, 67, 79, 80; 156/345

(56) References Cited

U.S. PATENT DOCUMENTS

| | | | | |
|---|---|---|---|---|
| 4,246,060 A | * | 1/1981 | Keller | 156/345 |
| 4,394,237 A | * | 7/1983 | Donnelly et al. | 204/192 E |
| 5,271,800 A | * | 12/1993 | Koontz et al. | 156/643 |
| 5,568,978 A | * | 10/1996 | Johnson et al. | 374/161 |
| 5,738,756 A | * | 4/1998 | Liu | 156/627.1 |
| 5,807,761 A | * | 9/1998 | Coronel et al. | 438/14 |
| 5,871,658 A | * | 2/1999 | Tao et al. | 216/60 |
| 5,877,032 A | * | 3/1999 | Guinn et al. | 438/9 |
| 5,986,272 A | * | 11/1999 | Britton, Jr. et al. | 250/459.1 |
| 6,036,876 A | * | 3/2000 | Chen et al. | 216/67 |
| 6,062,729 A | * | 5/2000 | Ni et al. | 374/161 |
| 6,166,779 A | * | 9/2000 | Johnson et al. | 374/161 |
| 6,153,115 A | * | 11/2000 | Le et al. | 216/60 |
| 6,160,621 A | * | 12/2000 | Perry et al. | 356/381 |
| 2001/0003487 A1 | * | 6/2001 | Miles | 359/260 |

FOREIGN PATENT DOCUMENTS

JP 63229718 A * 6/1988 ................ 156/345

* cited by examiner

Primary Examiner—Diego Gutierrez
Assistant Examiner—Gail Verbitsky
(74) Attorney, Agent, or Firm—Ladas & Parry

(57) ABSTRACT

The present invention provides a method and apparatus of using optical temperature measurement as an in-situ monitoring of etch rate. First of all, a plasma etching process is performed in a plasma etcher having a vacuum chamber. Then, an optical multi-channel analyzer (OMA) monitors a series of emission lines of a certain plasma species emitted from the vacuum chamber during the plasma etching process. Then, based on the intensity distribution of the emission lines detected, a computer computes and generates an optical temperature. Finally, the computer generates a relevant ER based on the optical temperature. The emission lines are emitted due to the transitions between different energy states of a certain plasma species. These transitions may be between different electronic energy states, vibrational energy states, or rotational energy states, whereas the plasma species may be any one of the reactants in the plasma chamber such as $CO$, $CO_2$, $CF$, $CF_2$, $SiF$, $C_2$, $HF$, etc.

14 Claims, 4 Drawing Sheets

OPTICAL TEMPERATURE MEASUREMENT AS AN IN SITU MONITOR OF ETCH RATE

BACKGROUND OF THE INVENTION

1. Field of the Invention

The present invention generally relates to a method and apparatus of etch rate measurement. More specifically, the present invention relates to a method and apparatus of using optical temperature measurement as an in-situ monitor of etch rate during a plasma process.

2. Description of the Related Art

In order to obtain a reliable etching process, the etch rate (ER) of each plasma etcher during the manufacture of semiconductors must be closely monitored and controlled. Accordingly, it is becoming an important issue for the semiconductor industry to devise an efficient and accurate way of measuring the ER.

Conventional methods of ER measurement can be classified into two major categories. The first type involves etching directly on a test wafer; then the ER is obtained through comparing the differences in the thickness of the test wafer before and after etching. As a result, this procedure is both wafer- and time-consuming and thereby cannot be called in-situ. The accuracy of the ER measurement is also strictly dependent on the accuracy of the thickness measurement tool. On the other hand, a more advanced second type of ER measurement is typically known as in-situ depth/thickness monitoring. In this type of measuring tool, thickness change (i.e. ER) is monitored according to the principle of optical interferometry, which makes the test wafer unnecessary and thus saves time and wafer cost. Nevertheless, several factors are affecting the accuracy of the ER measurements that are carried out according to the conventional methods. In particular, the interference wave pattern depends critically on the refractive index of the film being measured. If there is any impurity or non-uniformity in the film, the wave pattern generated can be different from the normal one. Consequently, the measured ER might be different, too, and as a result it is possible that wrong decision might be made for the control of the etching process. Another issue presented by the conventional ER measuring method is that the light source used for monitoring a specific type of material usually has only a single wavelength. For monitoring a different type of material, another wavelength has to be chosen, which means that different etcher adjustments are needed.

SUMMARY OF THE INVENTION

Accordingly, it is an object of the present invention to provide a method and apparatus of in-situ ER measurement without the requirement of a light source.

Another object of the present invention is to provide a real-time ER measurement that will not be affected by the quality of the film being measured.

The present invention achieves the above-indicated objects by providing a method and apparatus of optical temperature measurement as an in-situ monitor of etch rate. First of all, according to the present invention, a plasma etching process is performed in a plasma etcher having a vacuum chamber. Then, an optical multi-channel analyzer (OMA) monitors a series of emission lines of a certain plasma species emitted from the vacuum chamber during the plasma etching process. Then, based on the intensity distribution of the emission lines detected, a computer computes and generates an optical temperature. Finally, the computer generates a relevant ER based on the optical temperature.

The emission lines are emitted due to the transitions between different energy states of a certain plasma species. These transitions may be between different electronic energy states, vibrational energy states, or rotational energy states, whereas the plasma species may be any one of the reactants in the plasma chamber such as CO, $CO_2$, CF, $CF_2$, SiF, $C_2$, HF, etc.

The first major advantage of the present invention relates to the savings of time and money because the cost for test wafers and the time required for measuring the thickness of each test wafer can be excluded according to the method of the present invention.

The second major advantage of the present invention relates to the improved accuracy of the ER measurement that can be provided by the present invention. Since different plasma species emit different emission lines, the present invention can accurately obtain the optical temperature of the subject plasma species (i.e. the plasma in the excited state) which correlates to the real-time ER in the plasma chamber by selectively monitoring a plurality of emission lines that correlates to the subject plasma species.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 1:
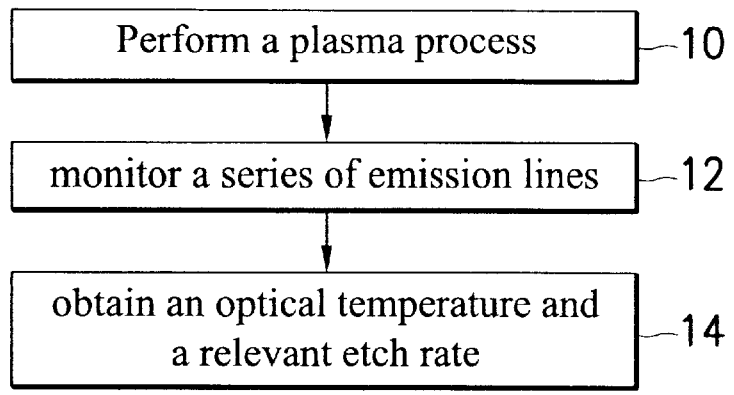
FIG. 1 shows a flow chart illustrating the method of optical temperature measurement according to the present invention.

FIG. 1 is a flow chart illustrating the steps required in the method of optical temperature measurement according to the present invention. In particular, this method provides an in-situ monitor of ER suitable for use with a plasma etcher. First of all, according to the present invention, a plasma etching process is performed in a plasma etcher 10 having a vacuum chamber. Then, a series of emission lines emitted by a certain plasma species are monitored during the plasma etching process 12. Finally, an optical temperature and a relevant ER are generated via a computer based on the intensity distribution data of the emission lines 14.

Figure 2:
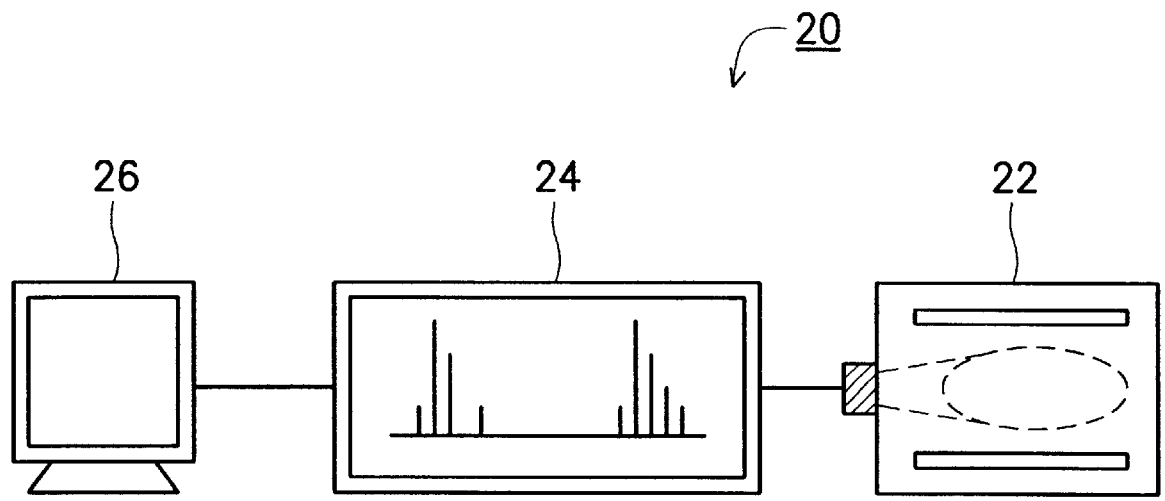
FIG. 2 illustrates a diagram of an apparatus according to the present invention.

Furthermore, an apparatus in accordance with the method of the present invention is also provided. FIG. 2 illustrates a diagram of an apparatus according to the present invention. The apparatus (i.e. plasma etcher) shown includes a vacuum chamber 22, an optical multi-channel analyzer (OMA) 24 and a computer 26. Wherein, the vacuum chamber 22 is used for proceeding a plasma etch process while the OMA 24 monitors a series of emission lines emitted by a certain plasma species in the vacuum chamber throughout the entirety of the plasma process. The computer 26 then generates an optical temperature and a relevant etch rate (ER) through computations based on the intensity distribution data of the emission lines.

The essence of the present invention lies in building a correlation between the excited state of the species in the vacuum chamber 22 and the real-time ER. By monitoring the emission lines of a certain plasma species at their excited state, the optical temperature of the subject plasma species can be obtained through computations. It is also obvious that the chemical reaction rate in the vacuum chamber must be correlated to the optical temperature of the subject plasma species. Finally, an accurate real-time ER can be obtained, from the calculated optical temperature, by looking up a table or by a simple calculation.

Figure 3:
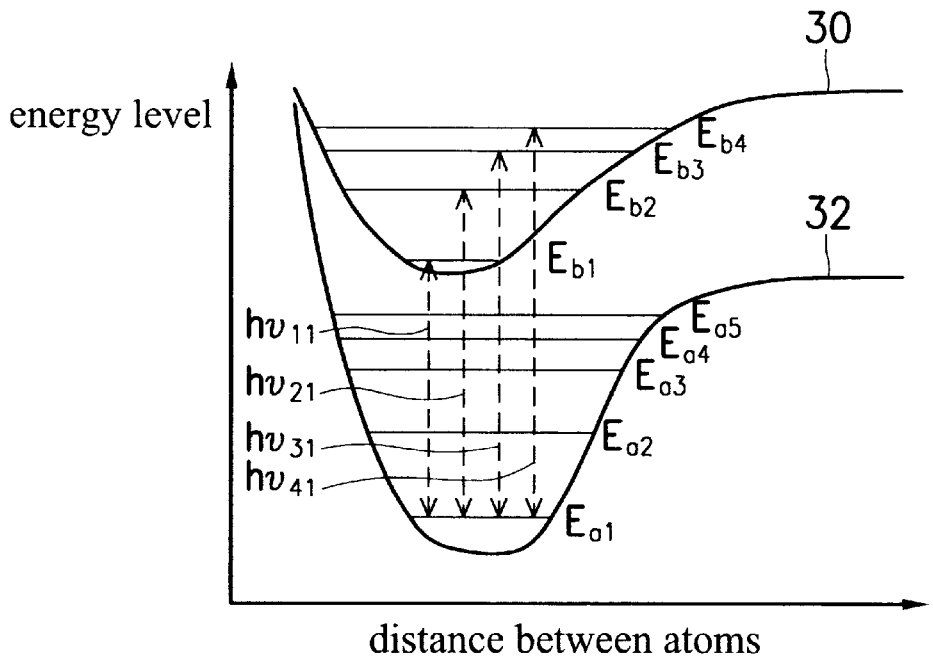
FIG. 3 illustrates the transitions between different energy levels of a certain plasma species.

FIG. 3 illustrates the transitions between different energy levels of a certain plasma species. Further, it is well known that the states of the energy levels of a species can be classified into electronic state, vibrational state, and rotational state. The two curves in FIG. 3 represent an upper electronic state 30 and a lower electronic state 32, respectively, where both the upper and the lower electronic states (30 & 32) can be further split into a plurality of vibrational states, as represented by the paralleled lines $E_{a1} \sim E_{a5}$ and $E_{b1} \sim E_{b4}$ shown in FIG. 3. In consequence, photon emission is one way to release the energy difference when molecules of the subject plasma species transit from a higher energy level to a lower energy level. As shown in FIG. 3, when one molecule transits its energy state from $E_{b1}$ to $E_{a1}$, a photon with an energy of $h\nu\|(=E_{a1}-E_{b1})$ is released, which emits a light, i.e. a spectrum, with a frequency of $\nu\|$.

The emission spectrum of each plasma species is unique. Such a characteristic can serve as "plasma fingerprint". By checking the emission spectrum of the species of interest, one can understand properties of the plasma species and thereby factors that influence the etch processes.

The emission intensity of a particular frequency is proportional to the density of a plasma species whose molecules change their energy states by emitting photons with that particular frequency. The relationship between emission intensity and the density of the plasma species can be briefly defined as $$I\lambda \alpha \Phi N q \lambda, \quad (1)$$

where $I\lambda$ is the emission intensity;

$\lambda$ is the emission wavelength;

q is the Frank-Condon factor in relation to the transition probability;

N is the density of the plasma species; and $\Phi$ is the sensitivity of a detector.

The density distributions of a plasma species at different energy states indicate different energy levels of the excited plasma species, which can be mathematically converted into deriving an optical temperature. Moreover, there are different kinds of optical temperatures to be measured for a certain plasma species, such as the electronic temperature $T_{ele}$, the vibrational temperature $T_{vib}$ and the rotational temperature $T_{rot}$, which are derived from the density distributions of the plasma species in transitions between different energy levels of electronic state, vibrational state, and rotational state, respectively. For example, the vibrational temperature $T_{vib}$ can be derived from a mathematical equation taught in a standard quantum physics textbook, in which:

$$N(v') \alpha \exp[-E(v')/(k_b T_{vib})], \quad (2)$$

where $N(v')$ is the density of a certain plasma species at vibrational state $v'$;

$E(v')$ is the energy level of the vibrational state $v'$, which is a function of vibrational quantum number $v'$;

$k_b$ is the Boltzman constant; and $T_{vib}$ is the vibrational temperature.

Figure 4:
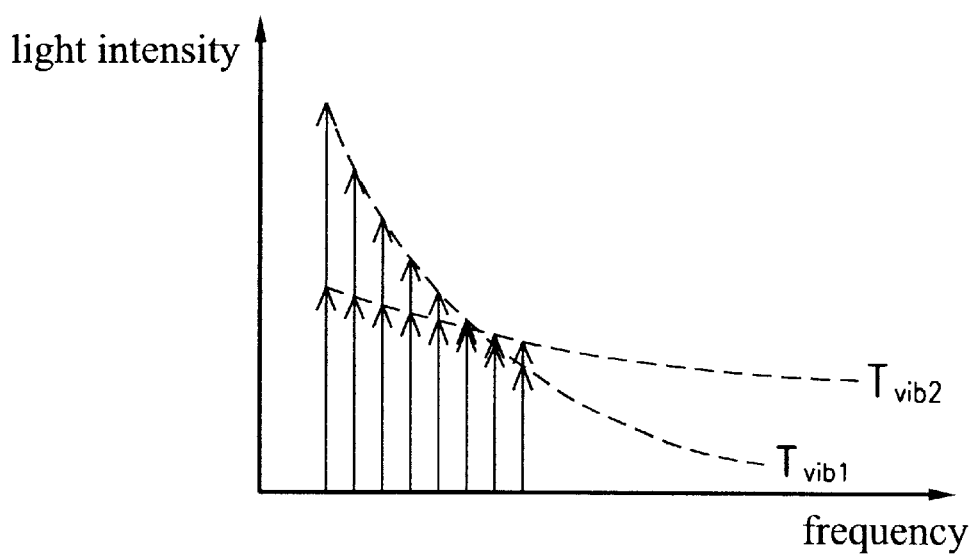
FIG. 4 illustrates two different distribution curves of light intensity vs. frequency.

To obtain the ER of a plasma etching process according to the present invention, a plurality of transitions in the energy state of a certain species are taken into consideration to constitute as a frame of reference. For example, the CO emission lines in the energy transition of $d^3\Pi(v') \rightarrow a^3\Pi(v'')$ has a wavelength variation of from 430 nm to 830 nm, respectively. With the upper state ($d^3\Pi$) vibrational quantum number $v'$ varied, say, from 0 to 9, and the lower state ($a^3\Pi$) vibrational quantum number $v''$, say, fixed to 0, we can obtain a series of 10 emission lines. In addition, by monitoring the intensities of these 10 emission lines during a particular plasma etching process and then calculating by Eq. 1, the molecular densities of the excited plasma species at different energy levels of the upper state vibrational quantum number $v'$ can be obtained. In particular, an emitted light intensity of a certain frequency correlates to a density of the subject plasma species at a certain energy level of the upper state vibrational quantum number $v'$. The energy distribution of the subject plasma species, which correlates to the emitted light intensity, is thus obtained. Since the energy level $E(v')$ for each vibrational quantum number is immediately obtained from the established energy distribution after the upper state vibrational quantum number $v'$ is selected, the particular vibrational temperature $T_{vib}$ can be derived therefrom by Eq. 2 and by methods of curve fitting, sampling, or other simple mathematical algorithms. By example, FIG. 4 illustrates two different distribution curves of light intensity derived by Eq. 1 and Eq. 2. These two distribution curves represent two different sets of vibrational temperature distribution, i.e. $T_{vib1}$ and $T_{vib2}$, wherein $T_{vib2}$ is higher than $T_{vib1}$.

By accumulating various experimental data sets, a reference table or an equation for correlating between the vibrational temperature and the ER can be established. In addition, each time an etching process is performed, a real-time ER can be obtained by first monitoring the intensity distributions of, for example, the above-mentioned 10 emission lines. The vibrational temperature $T_{vib}$ is then calculated by using Eq. 2. Finally, the ER of a particular plasma etching process is obtained by searching from the established reference table. All of the above steps are in situ and can be achieved by an apparatus according to the present invention comprising a vacuum chamber of a plasma etcher, an OMA, and a computer. As a result, no test wafers and related operations thereto will be needed.

Figure 5:
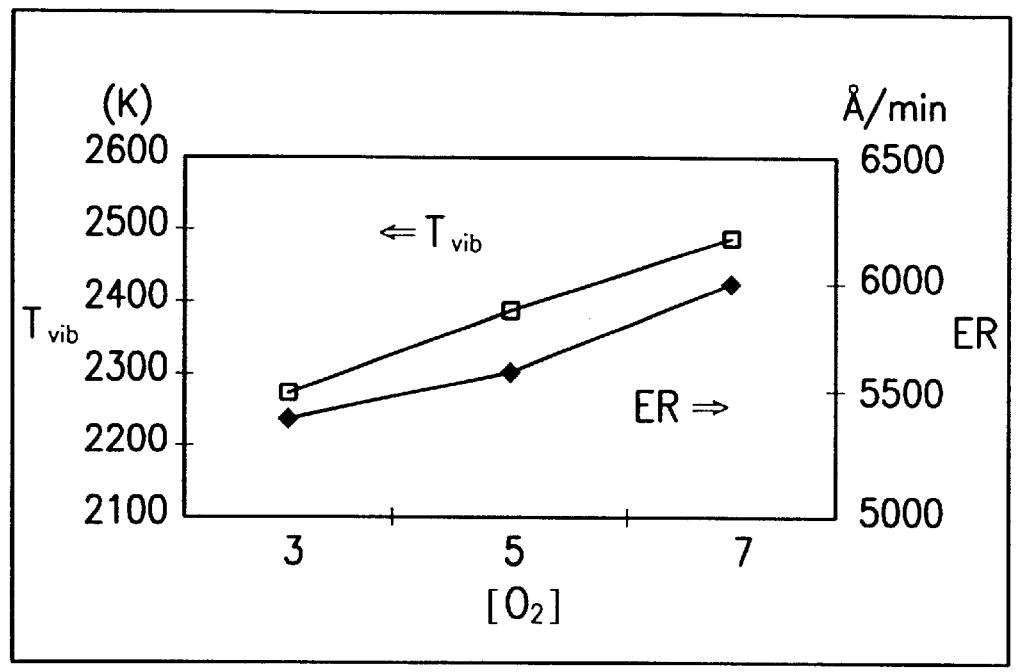
FIG. 5 shows the relationship between oxygen flow rate, vibrational temperature, and etch rate.

Referring to FIG. 5, the relationship between oxygen flow rate, vibrational temperature, and etch rate is shown such that the formation of fluorine can be increased by increasing the oxygen flow rate during the plasma etching process to enhance the silicon-oxide etch rate, which is implied by the equation:

$$CF_2+O \rightarrow CO+2F \quad (3)$$

FIG. 5 also illustrates the relationship shown by eq. 3 in which ER is increased as the oxygen flow rate increases.

Meanwhile, the vibrational temperature derived from the light intensity distribution curve due to energy transitions of CO is also increased as the oxygen flow rate increases.

Figure 6:
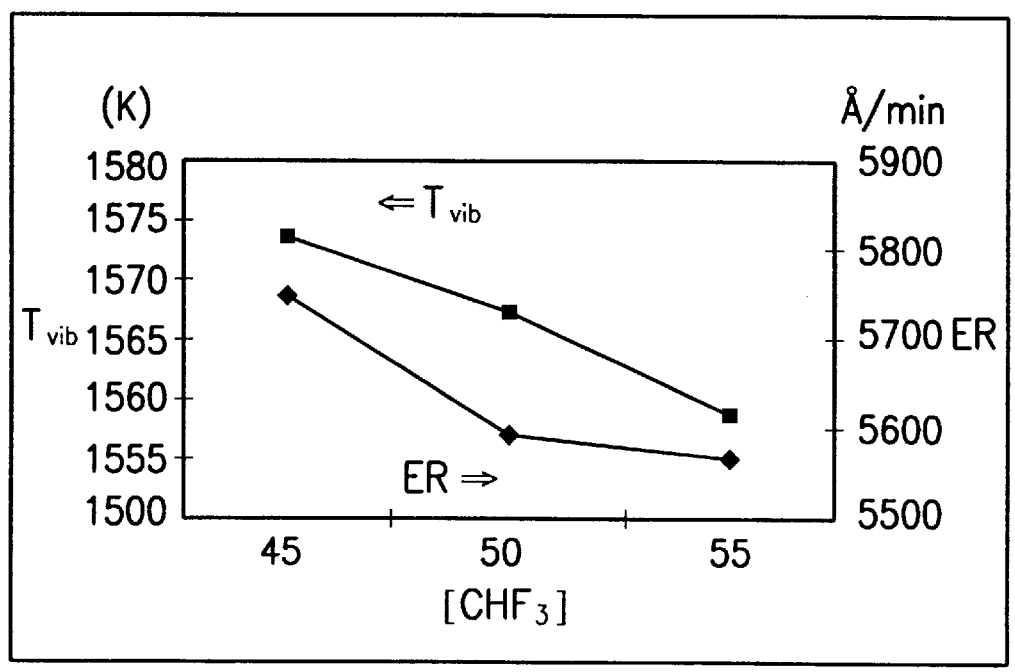
FIG. 6 shows the relationship between CHF3 flow rate, vibrational temperature, and etch rate.

Referring to FIG. 6, the relationship between CHF3 flow rate, vibrational temperature, and etch rate is shown such that the formation of polymer can be increased by increasing the CHF3 flow rate during the plasma etching process to suppress the silicon-oxide etch rate. Meanwhile, vibrational temperature derived from the light intensity distribution curve due to transitions of CO is also increased as the CHF3 flow rate increases.

Judging by FIG. 5 and FIG. 6, vibrational temperature is roughly in a directly proportional relationship with the ER and thus can be a good indicator for ER monitoring.

Furthermore, the particular species chosen as the subject to be monitored can be either an inert gas or a reactive gas in the vacuum chamber of a plasma etcher such as CO, $CO_2$, CF, $CF_2$, SiF, $C_2$, HF etc. The main considerations for choosing a species is in the stability and the light intensity of the plasma species such that the spectrum emission of the plasma species at its excited states can be steadily detected and monitored in the vacuum chamber by a OMA. obviously, two species in the same vacuum chamber can also be selected in order to double-check and the estimated ER.

Figure 7A:
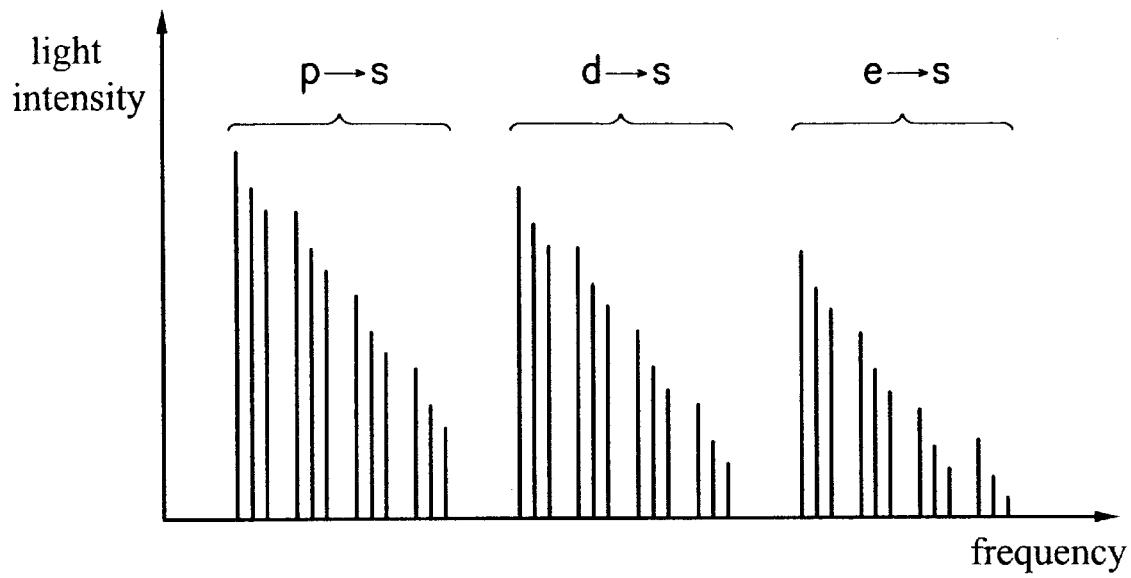
FIG. 7a illustrates the spectrum emission groups of a plasma species, wherein each group represents a different energy transition level.
Figure 7B:
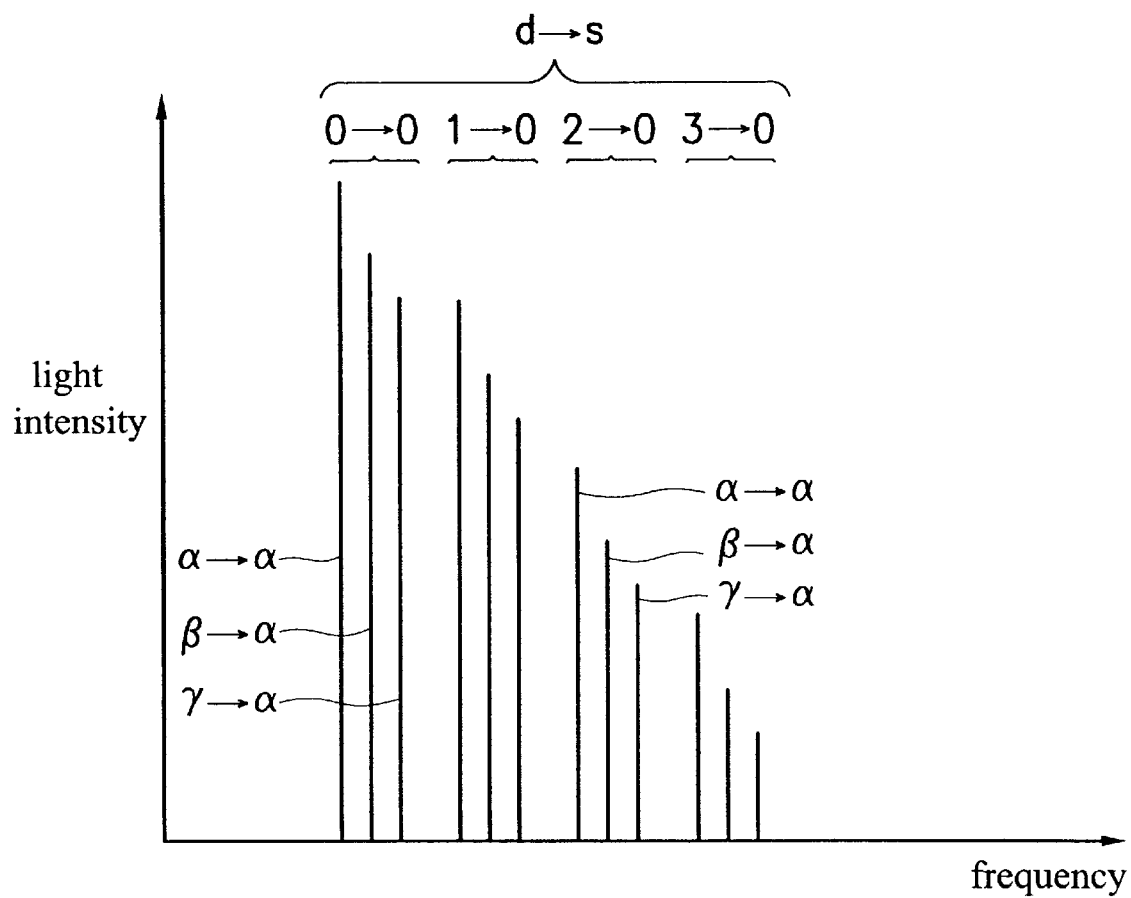
FIG. 7b is an enlarged diagram of FIG. 7a illustrating the spectrum emission group d→s.

Beside deriving from the vibrational temperature, the ER of a particular plasma etching process can also be estimated by deriving from the electronic temperature or the rotational temperature, which are based on the energy transitions of the electronic state and the rotational state, respectively, of a plasma species. FIG. 7a illustrates the spectrum of a certain species. FIG. 7b is an enlarged diagram of FIG. 7a illustrating the spectrum emission at the energy transition d→s,. Furthermore, the aforementioned electronic states, for example, can be marked as s, p, d and e energy states, wherein the s state denotes the lowest energy level while the e state being the highest energy level. By the same token, the vibrational states can be marked, from low to high, as 0, 1, 2, and 3 energy states, and the rotational states can be marked, also in a low-to-high order, as α, β, and γ energy states. As shown in FIG. 7a, emission lines can be classified into three major emission groups, e→s, d→s and p-s, which are emitted due to the transitions between different electronic states. As shown in FIG. 7b, each emission group can be further classified into three sub-groups, 0→0, 1→0, 2→0, and 3→0 which are emitted due to the transitions between different vibrational states. Each sub-group can still be further classified into three emission lines, α→α, β→α and γ→α, which are emitted due to the transitions between different rotational states. If an OMA has a better frequency resolution to identify the finest emission lines, such as α→α, β→α and γ→α, it can estimate ER by taking the rotational temperature $T_{rot}$ as an indicator. However, if an OMA has a relatively poor frequency resolution that can only identify the major emission groups, it can estimate ER by taking the electronic temperature $T_{ele}$ as an indicator.

The present invention provides a method for estimating ER by monitoring the intensity distribution of the emission lines emitted from a plasma species and by generating a relevant ER based on a calculated optical temperature. Since the emission spectrums of each plasma species are uniquely different from those of the other plasma species, the estimated ER derived therefrom can not be disturbed by the other irrelevant plasma species. Thus an accurate ER can be obtained.

In contrast to the conventional ER measurement methods, the present invention utilizes a certain reacting plasma species in its excited state in the vacuum chamber of a plasma etching machine as an indicator for estimating the ER of a plasma etching process. As a result, test wafers and related operations can be made unnecessary. In addition, films for photo-etching the wafer will not affect the ER measurement according to the present invention since the above-mentioned optical temperature, which is required for calculating an ER, can not be influenced by the films being used.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of using optical temperature measurement as an in-situ monitor of etch rate, comprising the steps of:

performing a plasma process in a plasma etcher;

monitoring, during the plasma process, a series of emission lines emitted by a certain plasma species;

determining an intensity distribution of the emission lines;

obtaining an optical temperature based on the intensity distribution of the emission lines; and;

obtaining an etch rate based on the optical temperature.

2. The method as claimed in claim 1, wherein the emission lines are emitted due to transitions between different energy states of the plasma species.

3. The method as claimed in claim 1, wherein the plasma process uses at least one reactive gas, and the plasma species is one of the reactive gases.

4. The method as claimed in claim 1, wherein the plasma species is selected from the group consisting CO, $CO_2$, CF, $CF_2$, SiF, $C_2$ and HF.

5. The method as claimed in claim 1, wherein the emission lines are emitted due to transitions between different electronic energy states of the plasma species.

6. The method as claimed in claim 1, wherein the emission lines are emitted due to transitions between different rotational energy states of the plasma species.

7. The method as claimed in claim 1, wherein the emission lines are emitted due to transitions between different vibrational energy states of the plasma species.

8. An apparatus using optical temperature measurement as an in-situ monitor of etch rate, comprising:

a vacuum chamber for processing a plasma process;

an optical multi-channel analyzer for monitoring, during the plasma process, a series of emission lines emitted by a certain plasma species in the vacuum chamber, and a computer for determining an intensity distribution of the emission lines, calculating an optical temperature based on the intensity distribution of the emission lines and obtaining a relevant etch rate from the optical temperature.

9. The apparatus as claimed in claim 8, wherein the emission lines are emitted due to transitions between different energy states of the plasma species.

10. The apparatus as claimed in claim 8, wherein the plasma process uses at least one reactive gas, and the plasma species is one of the reactive gases.

11. The apparatus as claimed in claim 8, wherein the plasma species is selected from the group consisting CO, $CO_2$, CF, $CF_2$, SiF, $C_2$ and HF.

12. The apparatus as claimed in claim 8, wherein the emission lines are emitted due to transitions between different electronic energy states of the plasma species.

13. The apparatus as claimed in claim 8, wherein the emission lines are emitted due to transitions between different rotational energy states of the plasma species.

14. The apparatus as claimed in claim 8, wherein the emission lines are emitted due to transitions between different vibrational energy states of the plasma species.

* * * * *